United States Patent [19]
Takao et al.
[11] Patent Number: 4,510,569
[45] Date of Patent: Apr. 9, 1985

[54] A/D CONVERSION PERIOD CONTROL FOR INTERNAL COMBUSTION ENGINES

[75] Inventors: Mitsunori Takao, Kariya; Toshika Ban, Oobu, both of Japan

[73] Assignee: Nippondenso Co., Ltd., Kariya, Japan

[21] Appl. No.: 390,966

[22] Filed: Jun. 22, 1982

[30] Foreign Application Priority Data

Jun. 23, 1981 [JP] Japan ................................ 56-96913

[51] Int. Cl.³ ...................... G06F 15/20; G05B 15/02; H03K 13/02

[52] U.S. Cl. ................................ 364/431.12; 328/151; 340/347 SH

[58] Field of Search ...................... 364/431.06, 431.07, 364/431.12, 733, 734; 123/480, 486; 340/347 SH; 328/151; 324/77 A

[56] References Cited

U.S. PATENT DOCUMENTS 4,208,626 6/1980 Gregg, Jr. ........................ 324/77 A
4,213,134 7/1980 Chen ................................. 328/151
4,257,377 3/1981 Kinugawa et al. ............ 123/480 X
4,280,189 7/1981 Takato et al. ....................... 364/734
4,283,713 8/1981 Philipp ........................ 340/347 SH
4,424,568 1/1984 Nishimura et al. ........... 364/431.07

*Primary Examiner*—Felix D. Gruber
*Attorney, Agent, or Firm*—Cushman, Darby & Cushman

[57] ABSTRACT

A method and an apparatus for preventing pulsations of an A/D conversion period caused when a signal indicative of an operating condition of an internal combustion engine is subjected to the A/D conversion. The A/D conversion period is provisionally determined in accordance with the number of cylinders and speed of the engine or the number of cylinders and crank angle of the engine. Two successive A/D converted values resulting from the A/D conversion operations are compared and the next A/D conversion period is corrected in accordance with the resulting difference and the engine speed. This correcting operation is repeated to control the conversion period such that the A/D conversion is always effected at the center of the pulsations.

14 Claims, 8 Drawing Figures

A/D CONVERSION PERIOD CONTROL FOR INTERNAL COMBUSTION ENGINES

BACKGROUND OF THE INVENTION

The present invention relates to an internal combustion engine control method and apparatus for preventing a control variable of an engine from pulsating when it is subjected to the operation of analog-to-digital conversion, and more particularly the invention relates to a control method and apparatus which repetitively corrects the analog-to-digital conversion interval in accordance with the number of the engine cylinders and the engine speed.

In a known type of internal combustion engine control method in which the control variables of an engine, such as, the cooling water temperature, intake air pressure and intake air flow of the engine are detected by various sensors and subjected to the operation of analog-to-digital conversion (hereinafter referred to as A/D conversion) thereby controlling the engine to obtain the optimum operating condition, the A/D conversion of the control variables are conventionally effected at predetermined intervals or in synchronism with the conversion capacity of an A/D converter.

Of the analog output signals of the control variables detected by the sensors, if the output signal of the control variable which pulsates in synchronism with the engine rotation (e.g., in a sine wave form as shown by the solid line in FIG. 5) is subjected to the A/D conversion according to the prior art method, the engine control variable subjected to the A/D conversion is caused to vary even when the engine is operating in a steady-state condition, for example. In extreme cases, the occurrence of a particular relationship between the pulsation period of the control variable and the A/D conversion period results in the generation of a surge which is so large as to cause a detrimental effect on the exhaust emission and the drivability. In such a condition, it is impossible to ensure a fine control of the engine.

Even if a filter is provided to remove the pulsation of the control variable, the reduction rate is limited from the standpoint of the response during the transitional period making it impossible to overcome the foregoing deficiencies.

SUMMARY OF THE INVENTION

In view of the foregoing deficiencies in the prior art, it is the primary object of the present invention to provide a method and apparatus for controlling internal combustion engines which repeat the operation of determining an A/D conversion interval of an engine control variable which pulsates in synchronism with the engine rotation in accordance with the number of cylinders in the engine and the engine speed or the number of the cylinders and the engine crank angle, comparing the two A/D converted values resulting from the successive A/D conversion operations effected with the determined A/D conversion interval and correcting the next A/D conversion interval in accordance with the difference, thereby rapidly adjusting the timing of A/D conversion such that the pulsation's effective value (hereinafter referred to as an integration center) is subjected to the A/D conversion even upon a transition from the transitional condition to the steady-state condition. The intake air pressure and intake air flow of an engine are caused to pulsate by the overlapping of the intake and exhaust valves or the back flow of the combustion gas within the combustion chamber or from the exhaust pipe side. Thus, in the case of a four-cycle engine, for example, the pulsation frequency of the intake air pressure and intake air flow is given by (engine speed)×(number of cylinders /2). In other words, if N represents the engine speed (rpm) and m represents the number of cylinders, then the pulsation period is given by $(1.2\times10^5)/(m\times N)$ (msec) or 720/m (crank angle degrees). In the case of a two-cycle engine, the pulsation frequency becomes two times that of the four-cycle engine. Each of the intake air pressure and intake air flow will be represented by the respective sensor output waveform which is close to substantially a sine wave if the sensor output signal is passed through a filter circuit, and the intake air pressure will also take a waveform close to substantially a sine wave if the form of the pressure take-off structure from within the intake pipe up to the sensor is selected suitably. The integration center value of the waveform close to the sine wave appears repeatedly at intervals of a time which is an integral multiple of the half cycle. Thus, by automatically adjusting and converging the timing of A/D conversion such that the integration center value of the pulsation is subjected to the A/D conversion in the steady-state condition of the engine and then performing the operation of A/D conversion at intervals of $$\frac{1.2\times10^5}{m\times N}\times(2n-1)\ \text{(msec) or}\ \frac{720}{m}\times(2n-1)\ \text{(crank angle degrees)}$$

with n being a positive integer, it is possible to always subject the integration center of the pulsation to the A/D conversion, thereby improving the controllability of the engine and also realizing a reduction in the cost of the engine control apparatus through simplification of the filter circuits for removing the pulsation.

DESCRIPTION OF THE PREFERRED EMBODIMENTS

Figure 1:
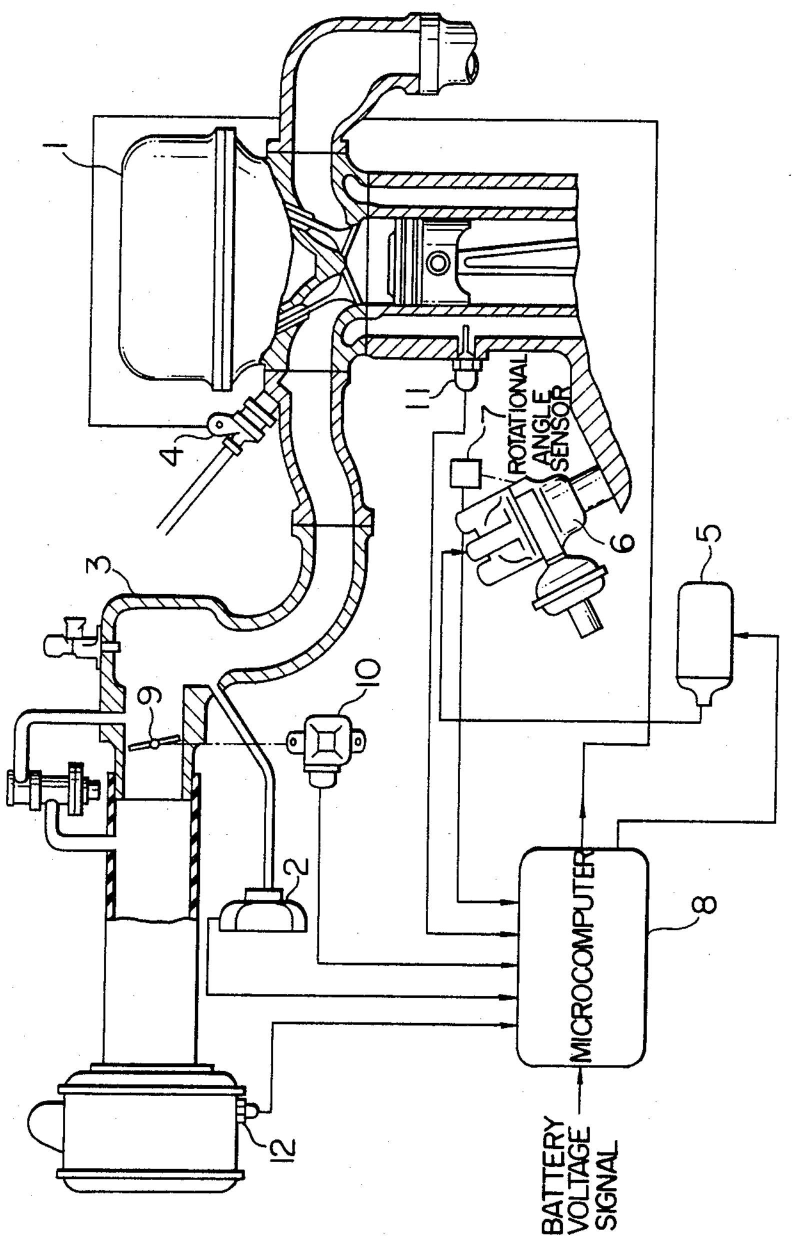
FIG. 1 shows by way of example the construction of an engine to which the invention is applied and its control system.

FIG. 1 shows the construction of a six-cylinder engine 1 to which is applied the control method of this invention and its control system.

In the Figure, numeral 2 designates a semiconductor-type intake pipe pressure sensor for detecting the pressure in an intake manifold 3, and 4 an electromagnetically-operated fuel injection valve fitted in the intake manifold 3 near each cylinder intake port so that the fuel is supplied at a regulated fixed pressure to the injection valves. Numeral 5 designates an ignition coil forming a part of an engine ignition system, and 6 a distributor for distributing the ignition energy generated from the ignition coil 5 to a spark plug fitted into each of the engine cylinders. As is well known in the art, the distributor 6 is rotated once for every two revolutions of the crankshaft of the engine and it incorporates a rotational angle sensor 7 for detecting the engine rotational angle. Numeral 9 designates a throttle valve of the engine, and 10 a throttle sensor for detecting a fully-closed position or substantially a fully-closed position of the throttle valve 6. Numeral 11 designates a cooling water temperature sensor for detecting the warming-up condition of the engine 1, and 12 an intake air temperature sensor for detecting the temperature of the inducted air. Numeral 8 designates a microcomputer for computing the magnitudes and timings of engine controlling control signals, that is, it receives the signals from the intake air pressure sensor 2, the rotational angle sensor 7, the throttle sensor 10, the cooling water temperature sensor 11 and the intake air temperature sensor 12 and a battery voltage signal and computes and controls on the basis of these signals the amount of fuel injected into the engine and the ignition timing of the engine.

Figure 2:
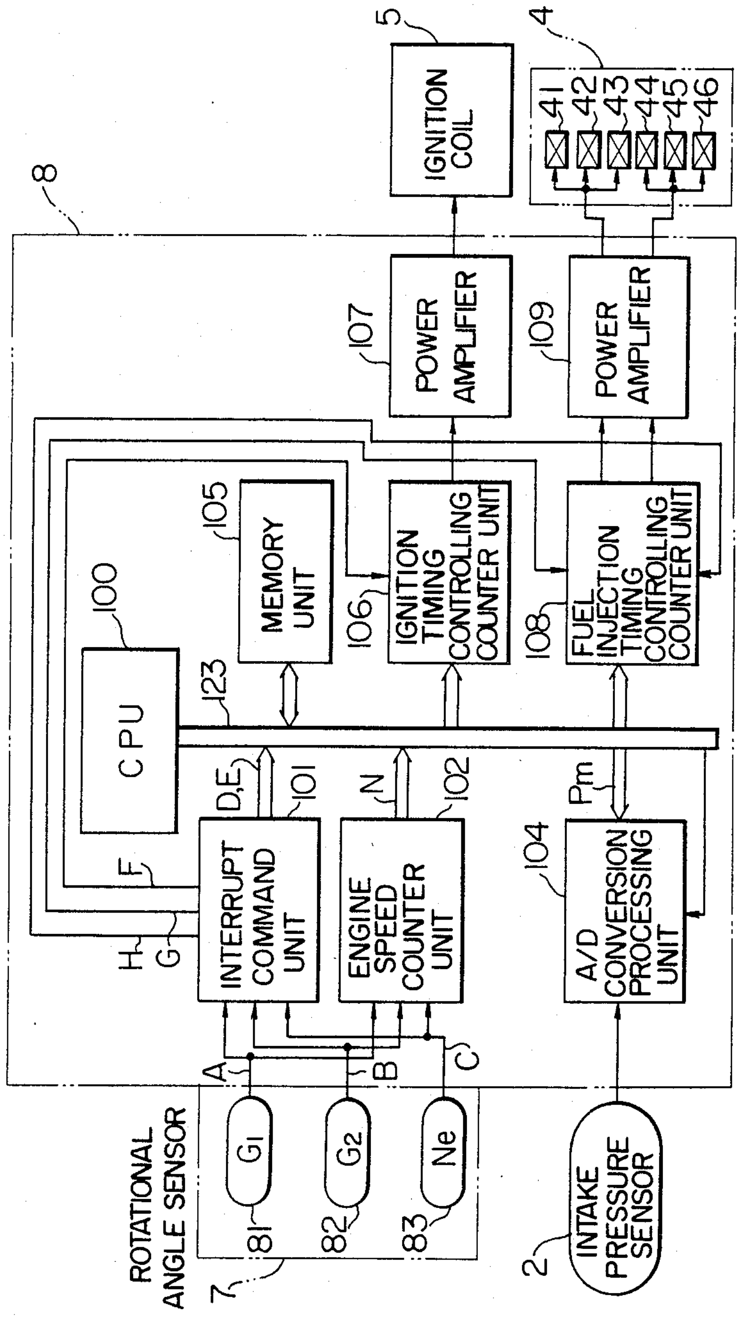
FIG. 2 is a detailed block diagram of the microcomputer shown in FIG. 1.

FIG. 2 is a block diagram for explaining in detail the construction of the microcomputer 8. In the Figure, numeral 100 designates a microprocessor unit (CPU) for computing the desired fuel injection quantity and ignition timing in response to interrupts. Numeral 101 designates an interrupt command unit responsive to the rotational angle signals from the rotational angle sensor 7 to command interrupt actions for the computation of fuel injection quantity and the computation of ignition timing and its output data are transmitted to the microprocessor unit 100 via a common bus 123. The interrupt command unit 101 also generates timing signals for controlling the operation initiating timings of units 106 and 108 which will be described later. Numeral 102 designates an engine speed counter unit for receiving the rotational angle signals from the rotational angle sensor 7 to count the period of a given rotational angle in response to the clock signals of a given frequency from the microprocessor unit 100 and compute the speed of the engine. Numeral 104 designates an A/D conversion processing unit having the function of subjecting the signal from the intake pipe pressure sensor 2 to A/D conversion and reading the same into the microprocessor unit 100. The output data from the units 102 and 104 are transmitted to the microprocessor unit 100 via the common bus 123. Numeral 105 designates a memory unit storing a control program of the microprocessor unit 100 and having the function of storing the output data from the units 101, 102 and 104 and the transmission of data between it and the microprocessor unit 100 is effected by way of the common bus 123. Numeral 106 designates an ignition timing controlling counter unit including a register whereby a digital signal indicative of the time of energization and the time of deenergization (or the ignition timing) of the ignition coil 5 computed by the microprocessor unit 100 is computed in terms of a time period and a timing corresponding to engine rotational angles (crank angles). Numeral 107 designates a power amplifier for amplifying the output of the ignition timing controlling counter unit 106 to energize the ignition coil 5 and control the time of deenergization of the ignition coil 5 or the ignition timing. Numeral 108 designates a fuel injection time controlling counter unit comprising two down counters having the same function and each adapted to convert a digital signal indicative of the opening time of the fuel injection valves 4 or the fuel injection quantity computed by the microcomputer unit 100 to a pulse signal having a time width which provides the opening time of the fuel injection valves. Numeral 109 designates a power amplifier for receiving the pulse signals from the counter unit 108 and supplying the same to the fuel injection valves 4 and it includes two channels to suit the construction of the counter unit 108.

Figure 3:
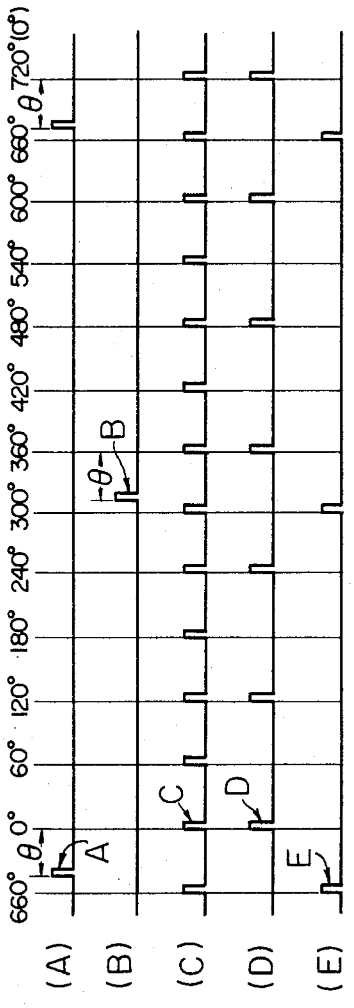
FIG. 3 shows by way of example a plurality of waveforms for explaining the operation of the microcomputer shown in FIG. 2.

The rotational angle sensor 7 comprises three sensors 81, 82 and 83 as shown in FIG. 2 and the first rotational angle sensor 81 is designed to generate an angle signal A at a position which is earlier than 0° crank angle by an angle $\theta$ once for every two revolutions of the engine crankshaft (i.e., one revolution of the distributor 6) as shown by the waveform in (A) of FIG. 3. The second rotational angle sensor 82 is designed to generate an angle signal B at a position which is earlier than 360° crank angle by the angle $\theta$ once for every two revolutions of the engine crankshaft as shown by the waveform in (B) of FIG. 3. The third rotational angle sensor 83 is designed to generate an equal number of angle signals as the number of the engine cylinders at equal intervals for every one revolution of the crankshaft that is, in the case of a six-cylinder engine as the present invention six angle signals C are generated at intervals of 60° starting at 0° crank angle.

The interrupt command unit 101 receives the angle signals (or the crankshaft rotational angle signals) from the rotational angle sensors 81, 82 and 83 to generate signals for commanding an interrupt for the computation of ignition timing and commanding as an interrupt for the computation of fuel injection quantity, and the frequency of the angle signal C from the third rotational angle sensor 83 is divided by 2 to generate an interrupt command signal D immediately after the generation of an angle signal A from the first rotational angle sensor 81 as shown in (D) of FIG. 3. This interrupt command signal D is generated six times for every two revolutions of the crankshaft, that is, the same number of signals D as the number of the engine cylinders are generated for every two crankshaft revolutions. Thus, in the case of the six cylinder engine, the signal D is generated once for every 120° of crank angle thereby commanding an ignition timing computation interrupt to the microprocessor unit 100. Also, the interrupt command unit 101 divides the frequency of the signal from the third rotational angle sensor 83 by 6 so that an interrupt command signal E is generated at the sixth signal C after the generation of the angle signals from the first and second rotational angle sensors 81 and 82, that is, the interrupt command signal E is generated at intervals of 360° (one revolution) starting at 300° crank angle as shown in (E) of FIG. 3, and the interrupt command signal E commands a fuel injection quantity computation interrupt to the microprocessor unit 100.

Figure 4A:
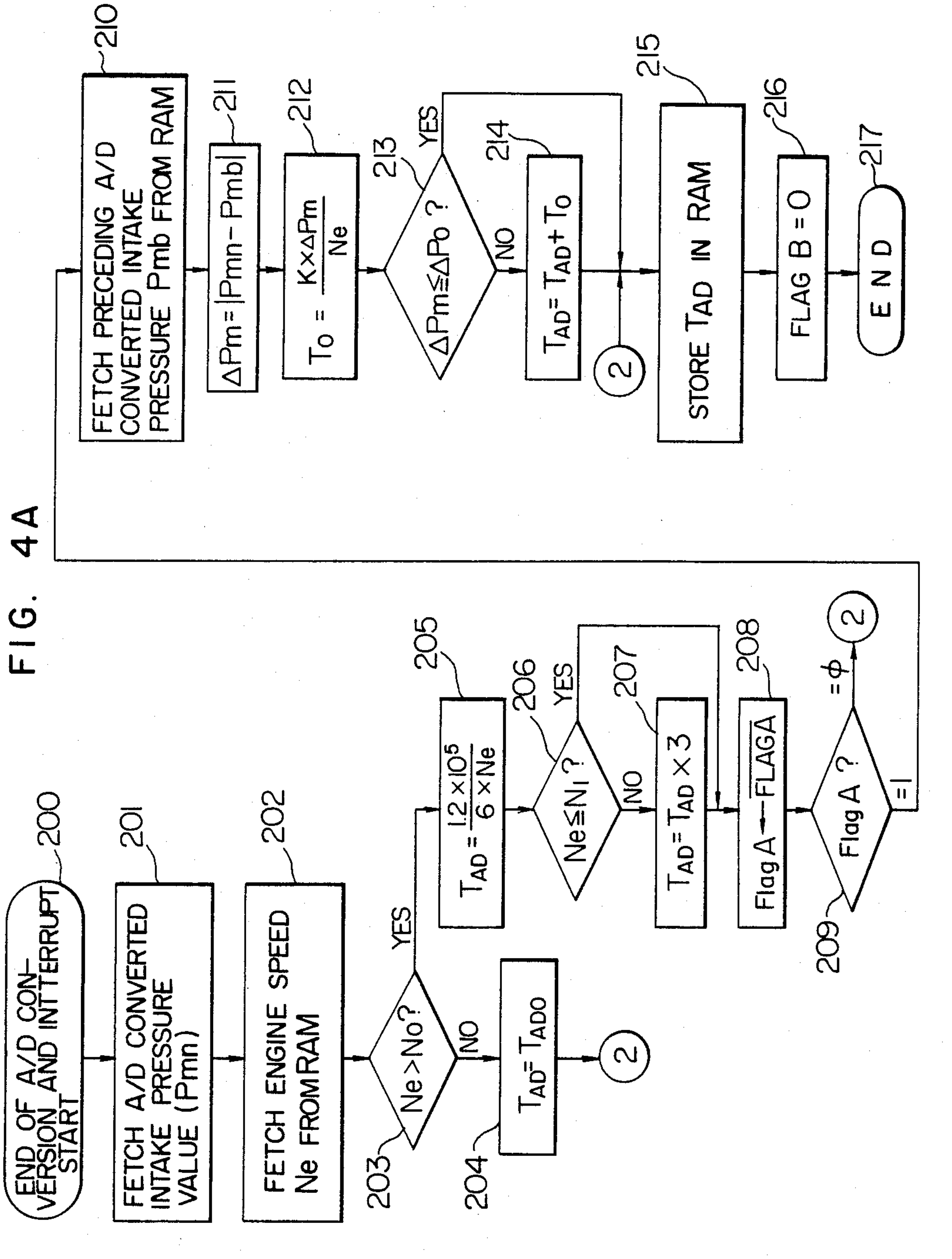
FIGS. 4A and 4B are flow charts for explaining a first embodiment of the invention.
Figure 4B:
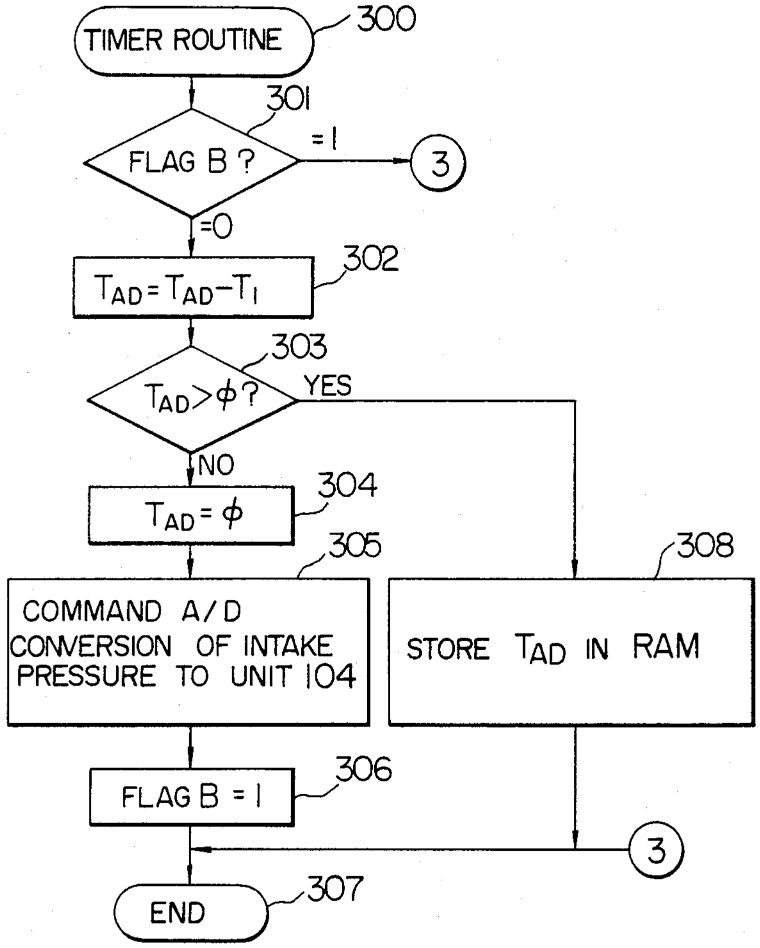

With respect to the above-described microcomputer 8, FIGS. 4A and 4B show simplified flow charts of the computational operations for performing the method of this invention in the case of a six-cylinder, four-cycle engine. The function of the microprocessor unit 100 will now be described with reference to the flow chart.

The microprocessor unit 100 usually executes a main routine and if, for example, an end-of-A/D-conversion indicating signal is applied from the A/D conversion processing unit 104 to the microprocessor unit 100, the microprocessor unit 100 interrupts the execution of the main routine and starts a routine for determining the next A/D conversion period $T_{AD}$ at an end of A/D conversion interrupt step 200. At step 201 is fetched an A/D converted value Pmn of the intake pressure, and at step 202 is fetched an engine speed Ne stored in an RAM.

A step 203 compares the engine speed Ne with a predetermined value No so that if $Ne < No$ or $Ne = No$, a transfer is made to a step 204 and a predetermined value $T_{ADo}$ is selected as the desired intake pipe pressure A/D conversion interval time $T_{AD}$; thereby making a transfer to a step 215. On the contrary, if $Ne > No$, a transfer is made to a step 205. The step 205 computes the desired intake pipe pressure A/D conversion period $T_{AD}$ from the previously mentioned expression $1.2 \times 10^5)/(6 \times Ne)$. A step 206 compares the engine speed Ne with a predetermined engine speed $N_1$ so that if $Ne > N_1$, a transfer is made to a step 207 so that the $T_{AD}$ computed by the step 205 is tripled (the multiplier is selected in consideration of the A/D conversion response characteristic) so as to be used as a new $T_{AD}$ and a transfer is made to a step 208. If the step 206 determines that $Ne \leqq N_1$, then a transfer is made to a step 208 and a logical flow control flag A is caused to change its state. Then, if a step 209 determines that the logical flow control flag A is 1, a transfer is made to a 210. If the logical flow control flag A is 0, a transfer is made to the step 215.

The step 210 fetches from the RAM the intake pressure Pmb of the preceding A/D conversion and a step 211 computes an intake pressure change $\Delta Pm$ between the A/D conversion period intervals. Then, a step 212 computes the value of To from the $\Delta Pm$ and Ne from an expression $K \times \Delta Pm/Ne$. Here K is a constant. In this expression, To is made proportional to $\Delta Pm$ such that when the value of $\Delta Pm$ is great and excessively remote from a desired adjusted state, the adjustment toward the desired value is made at a faster rate and the rate of adjustment is slowed down as the desired value is approached. On the other hand, To is made inversely proportional to Ne so as to ensure the same movement as the pulsation period. As a result, the value of To is determined to provide a relation [Ne (small)→period (large)→To (large)] or [Ne (large)→period (small)→To (small)]. A step 213 compares the $\Delta Pm$ with a predetermined value $\Delta Po$ so that if $\Delta Pm > \Delta Po$, a step 214 adds the To to the $T_{AD}$ to compute a new $T_{AD}$. Since the $T_{AD}$ is equal to the pulsation period, the operation of adding To is necessary for adjusting the A/D conversion timing to the integration center.

If $\Delta Pm \leqq \Delta Po$, a transfer is made to the step 215 and the $T_{AD}$ is stored in the RAM. Then a step 216 sets a logical flow control flag B to 0 and a step 217 completes the end of A/D conversion interrupt routine. In accordance with the A/D conversion period $T_{AD}$ determination routine comprising the steps 200 through 217, if the engine speed Ne is smaller than the predetermined value No, $T_{AD}$ is set to $T_{ADo}$, and if $No < Ne \leqq N_1$, $T_{AD}$ is set to $T_{AD}' = (1.2 \times 10^5)/(6 \times Ne)$ and the value of To is further added depending on the value of $\Delta Pm$. In other words, when there is a condition $\Delta Pm > \Delta Po$, the step 208 changes the state of the flag A each time an interrupt computation is performed and thus the value of $T_{AD}$ is changed alternately to the value of $T_{AD}'$ and $T_{AD}' + To$. When $Ne > N_1$ results, the $T_{AD}$ is changed to the value of $3T_{AD}'$ or $3T_{AD}' + To$ depending on the value of $\Delta Pm$.

On the other hand, as shown in FIG. 4B, a timer routine 300 is executed at intervals of a given time period $T_1$ performs the A/D conversion of the intake pipe pressure at the A/D conversion period $T_{AD}$ determined by the routine 200. A step 302 repeatedly performs the operation of subtracting $T_1$ from $T_{AD}$ so long as the value of $T_{AD}$ is positive and a step 305 commands the execution of the A/D conversion when the value of $T_{AD}$ becomes negative. In other words, a step 301 discriminates the state of the logical flow control flag B so that if the flag B is $\phi$ (zero) a transfer is made to the step 302. If the flag B is 1, a transfer is made to a step 307 and the processing of the timer routine is completed. The step 302 subtracts the processing time interval $T_1$ of the timer routine 300 from the $T_{AD}$ to obtain a new $T_{AD}$. A step 303 compares the newly obtained $T_{AD}$ with $\phi$ (zero) so that if $T_{AD}$23 0, a step 304 sets the $T_{AD}$ to zero and stores it in the RAM. Then, the step 305 causes the microprocessor unit 100 to send a necessary signal to the A/D conversion processing unit 104 and cause it to perform the A/D conversion of the intake pipe pressure. Then, a step 306 sets the logical flow control flag B to 1 and the step 307 completes the processing of the timer routine.

On the other hand, if $T_{AD} > 0$, a step 308 stores the value of $T_{AD}$ in the RAM and then transfers to the step 307 thereby completing the processing of the timer routine.

As described hereinabove, the timer routine is one which measures the value of $T_{AD}$ (about several tens milliseconds) by means of down counting, for example, to determine the timing of A/D conversion, and when the timer routine is executed at intervals of the given time $T_1$ (about 0.5 milliseconds) so that the step 305 applies an A/D conversion command signal to the unit 104 thereby initiating the execution of the A/D conversion interval computational routine at the step 200 in response to the command signal, during the transitional period where the engine speed rises and the successive A/D converted values tend to vary, the value of $\Delta Pm$ is increased and consequently the conversion period is set alternately to the values of $T_{AD}$ and $T_{AD} + To$ through the operations of the steps 208 and 209 which change and discriminate the state of the flag A.

Figure 5:
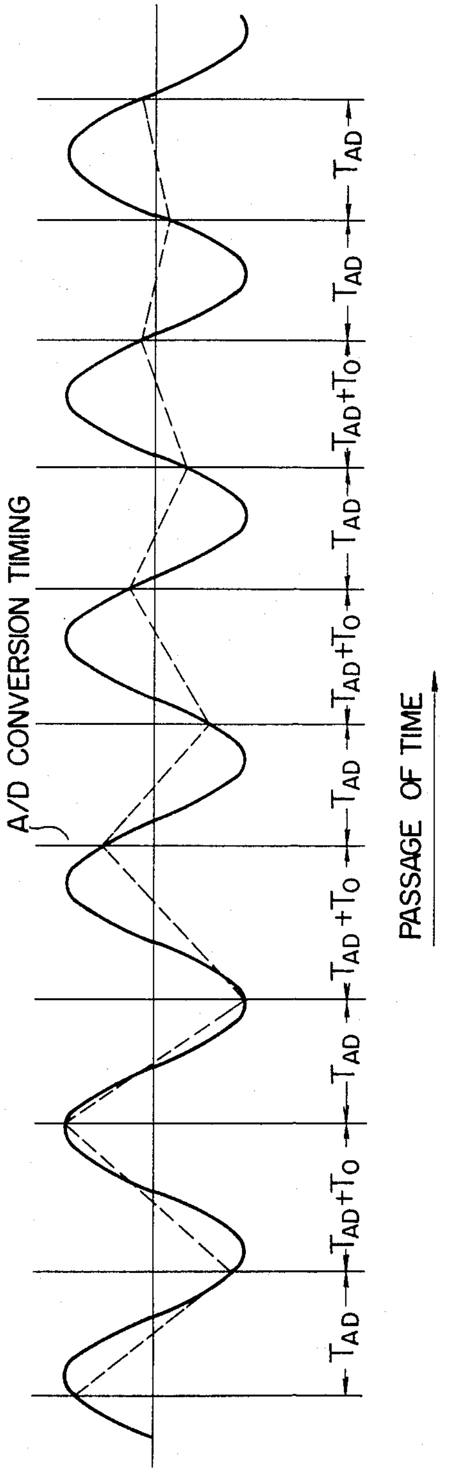
FIG. 5 is a characteristic diagram for explaining the control effect of FIG. 4.

In the steady-state operation where the successive A/D converted values tend to come close to a given value, the value of $\Delta Pm$ is decreased and thus the conversion interval is set to $T_{AD}$ in each execution of the computation in accordance with the decision of the step 213. In this way, the conversion interval $T_{AD}$ is subjected to a variable control and adjusted such that the decision of the step 213 shows a reduced value of $\Delta Pm$ and A/D converted values approach the given value. FIG. 5 shows an exemplary manner where after the transition of the engine from the transitional operation to the steady-state operation the logical flow control shown in FIGS. 4A and 4B adjusts the timing of A/D conversion so as to rapidly approach the integration center and thereby effect the operation of A/D conversion. In FIG. 5, the solid line shows by way of example an intake pressure indicative analog signal subject to the A/D conversion and the values at the intersections of the broken line and the solid line are subjected to the A/D conversion.

While, in the above-described embodiment of this invention, the invention is directed to the output of the pressure sensor, the invention is also applicable to the output of the air flow sensor. Further, while the above-described embodiments are directed to the six-cylinder engine, the invention is also applicable to other multiple cylinder engines such as four-cylinder and eight-cylinder engines. Still further, while the pressure sensor output is directly subjected to the operation of A/D conversion, the invention is also applicable to any signal obtained by circuit processing and not directly subjected to the conversion.

Figure 6A:
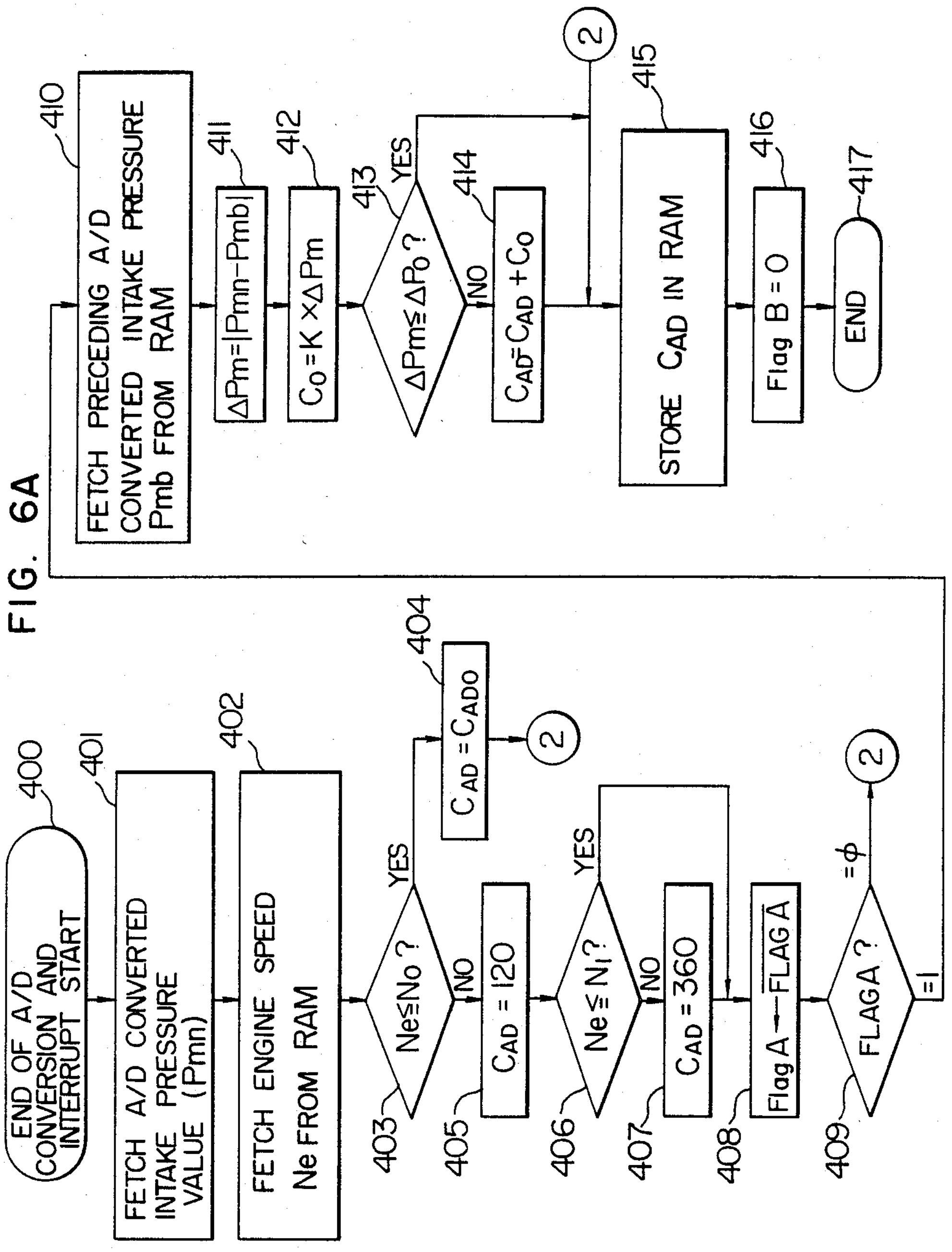
FIGS. 6A and 6B are flow charts for explaining a second embodiment of the invention.
Figure 6B:
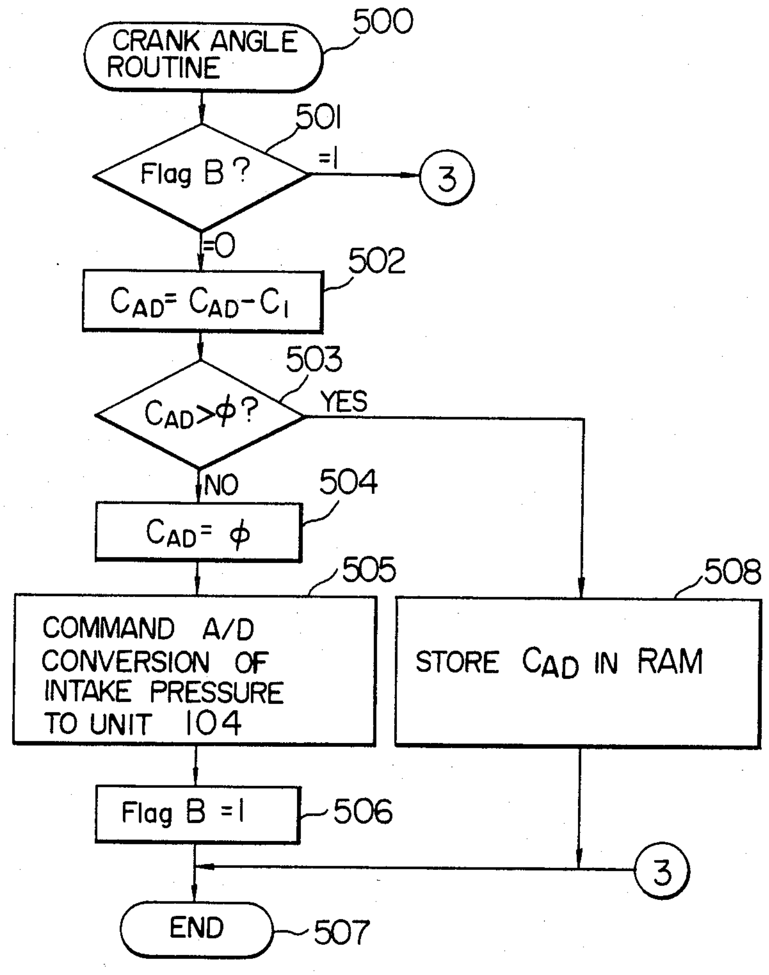

While, in the above-described embodiments, the A/D conversion interval is controlled in terms of time, the control can be accomplished in terms of crank angle degrees and FIG. 6 shows a logical flow chart for effecting the control in terms of crank angle degrees.

In FIG. 6, an end of A/D conversion interrupt processing routine 400 is the same with the counterpart of FIG. 4 except that the value of $T_{AD}$ (time) determined by the A/D conversion interrupt processing is replaced with the value of $C_{AD}$ (crank angle degrees). Note that a step 405 corresponding to the step 205 of FIG. 4 computes the value of $C_{AD}$ from the previously mentioned expression $$360 \times \frac{2}{m}(2n-1) \cdot CA.$$

Also, the processing of a crank angle routine 500 (executed at intervals of a given crank angle $C_I$) for performing the A/D conversion of intake pressure at an A/D conversion period $C_{AD}$ computed by the computational routine 400 to 417, is the same with that of the timer routine of FIG. 4B except that the $T_{AD}$ (time) and the processing time $T_I$ are respectively replaced by the $C_{AD}$ (crank angle) and angle $C_I$. Note that where the control is effected in terms of crank angle degrees, the third rotational angle sensor 83 must be replaced with a sensor which generates a signal for each 1° of crank angle.

From the foregoing it will be seen that in accordance with the present invention the operation of computing the A/D conversion interval of an engine control variable which pulsates in synchronism with the rotation of an engine in accordance with the number of the engine cylinders and the engine speed or the number of the engine cylinders and the engine crank angle, comparing two successive A/D converted values resulting from the A/D conversion operations effected at the computed A/D conversion intervals and correcting the next A/D conversion interval in accordance with the resulting difference and the engine speed is repeated so as to always subject the integration center of the pulsation to the A/D conversion, thereby improving the controllability (emission control and drivability) of the engine and simplifying the pulsation reducing filter circuit construction with the resulting reduction in the cost of the engine control unit.

We claim:

1. In a method of controlling operation of internal combustion engine having an arrangement for analog-to-digital converting at least one analog type pulsating control variable indicative of engine operation including at least one of intake air pressure and intake air quantity, said method comprising the steps of:

- detecting a cycle to cycle period of pulsation of the control variable;
- determining a conversion interval for the analog-to-digital converting corresponding to the detected cycle to cycle period of pulsation and controlling analog-to-digital conversion in accordance with the determined conversion interval;
- sampling the analog type pulsating control variable during a first cycle and during a second cycle immediately following the first cycle and analog-to-digital converting the samples in accordance with the determined conversion interval;
- determining a difference between converted digital values of the first and second cycles;
- updating the conversion interval previously determined so as to reduce the detected difference to update a next cycle conversion timing; and
- sampling the control variable during a third cycle and analog-to-digital converting the third cycle sample in accordance with the updated conversion interval.

2. A method according to claim 1, wherein said engine is a four-cycle engine, and wherein said analog-to-digital conversion interval is determined by the following expression $$\frac{1.2 \times 10^5}{m \times N}(2n-1) \text{ (milliseconds)}$$

where m represents the number of cylinders, N represents the engine speed (rpm) and n represents a given positive integer.

3. A method according to claim 1, wherein said engine is a four-cycle engine, and wherein said analog-to-digital conversion interval is determined by the following expression $$360 \times \frac{2}{m}(2n-1) \text{ (crank angle degrees)}$$

where m represents the number of cylinders and n represents a given positive integer.

4. A method according to claim 1, wherein said engine is a two-cycle engine, and wherein said analog-to-digital conversion interval is determined by the following expression $$\frac{0.6 \times 10^5}{m \times N}(2n-1) \text{ (milliseconds)}$$

where m represents the number of cylinders, N represents the engine speed (rpm) and n represents a given positive integer.

5. A method according to claim 1, wherein said engine is a two-cycle engine, and wherein said analog-to-digital conversion interval is determined by the following expression $$360 \times \frac{1}{m}(2n-1) \text{ (crank angle degrees)}$$

where m represents the number of cylinders and n represents a given positive integer.

6. A method according to claim 2, 3, 4 or 5, wherein the next A/D conversion interval is determined as a function of only the difference between two successive analog-to-digital converted values of said control variable.

7. A method according to claim 2 or 4, wherein the updated analog-to-digital conversion interval is determined as a function of the difference between two successive analog-to-digital converted values of said control variable and the speed of said engine.

8. In an arrangement for controlling the operation of an internal combustion engine which includes a system for analog-to-digital converting at least one analog type pulsating control variable indicative of engine operation including at least one of intake air pressure and intake air quantity, said arrangement comprising:

means for detecting a cycle to cycle period of pulsation of the control variable;

means for determining a conversion interval for analog-to-digital converting corresponding to the detected cycle to cycle period of pulsation and controlling analog-to-digital conversion in accordance with the determined conversion interval;

means for sampling the analog type pulsating control variable during a first cycle and during a second cycle immediately following the first cycle and analog-to-digital converting the samples in accordance with the determined conversion interval;

means for determining a difference between converted digital values of the first and second cycles;

means for updating the conversion interval previously determined so as to reduce the detected difference to update a next cycle conversion timing; and means for sampling the control variable during a third cycle and analog-to-digital converting the third cycle sample in accordance with the updated conversion interval.

9. An arrangement according to claim 8, wherein said engine is a four-cycle engine, and wherein said analog-to-digital conversion interval is determined by the following expression $$\frac{1.2 \times 10^5}{m \times N}(2n - 1) \text{ (milliseconds)}$$

where m represents the number of cylinders, N represents the engine speed (rpm) and n represents a given positive integer.

10. An arrangement according to claim 8, wherein said engine is a four-cycle engine, and wherein said analog-to-digital conversion interval is determined by the following expression $$360 \times \frac{2}{m}(2n - 1) \text{ (crank angle degrees)}$$

where m represents the number of cylinders and n represents a given positive integer.

11. An arrangement according to claim 8, wherein said engine is a two-cycle engine, and wherein said analog-to-digital conversion interval is determined by the following expression $$\frac{0.6 \times 10^5}{m \times N}(2n - 1) \text{ (milliseconds)}$$

where m represents the number of cylinders, N represents the engine speed (rpm) and n represents a given positive integer.

12. An arrangement according to claim 8, wherein said engine is a two-cycle engine, and wherein said analog-to-digital conversion interval is determined by the following expression $$360 \times \frac{1}{m}(2n - 1) \text{ (crank angle degrees)}$$

where m represents the number of cylinders and n represents a given positive integer.

13. An arrangement according to claim 9, 10, 11 or 12, wherein the next A/D conversion interval is determined as a function of only the difference between two successive analog-to-digital converted values of said control variable.

14. An arrangement according to claim 9 or 11, wherein the updated analog-to-digital conversion interval is determined as a function of the difference between two successive analog-to-digital converted values of said control variable and the speed of said engine.

* * * * *